United States Patent [19]

Sechrist

[11] 4,334,593

[45] Jun. 15, 1982

[54] SOUND REPRODUCTION SYSTEM

[76] Inventor: Edward L. Sechrist, 30446 County Rd., 12 West, Elkhart, Ind. 46514

[21] Appl. No.: 207,746

[22] Filed: Nov. 18, 1980

[51] Int. Cl.³ .............................................. H05K 5/00

[52] U.S. Cl. .................................................. 181/144

[58] Field of Search ................................ 181/144-147, 181/151, 156, 163

[56] References Cited

U.S. PATENT DOCUMENTS 3,160,225 12/1964 Sechrist .............................. 181/151

3,434,564 3/1969 Sechrist .............................. 181/144

*Primary Examiner*—L. T. Hix

*Assistant Examiner*—Thomas H. Tarcza

*Attorney, Agent, or Firm*—Oltsch, Knoblock & Hall

[57] ABSTRACT

A sound reproduction system having a housing with a lateral slot in the front wall thereof, one or more sound reproducing speakers located below the slot, and a plurality of resonance chambers located between the speakers forming bass, treble and mid-range sections.

10 Claims, 8 Drawing Figures

SOUND REPRODUCTION SYSTEM

SUMMARY OF THE INVENTION

The invention relates to sound reproduction systems and has specific application to a sound resonance assembly used in connection with sound reproducing speakers.

This invention incorporates in a housing, one or more moving cone speakers and a series of resonance chambers. The housing front wall has an opening formed in its lower end to accommodate each speaker and a lateral slot at its upper end. The resonance chambers are formed by panels having tapering sides and spaced from each other parallel to the front wall. The panels are grouped in three sections, each section composed of panels having a length different than the panels of another section. The sections are arranged with the small ends of the panels nearer the speakers and the large ends of the panels nearer the lateral slot in the housing. The sections are arranged from the housing front wall toward the housing rear wall in order of increasing length. The panels are spaced from each other at their side edges by spacers which form the outer edges of resonating compartments between the panels. Each compartment is divided into subchambers by additional spacers extending along its length and is designed to capture, resonate and amplify a given range of sound emitted by the speakers. These chambers, as a unit, add a sound quality not heretofore produced by sound reproduction systems.

Accordingly, it is an object of this invention to provide an improved sound reproduction system having resonance assemblies therein.

Another object of this invention is to provide a sound reproduction system having chambers which resonate and amplify sound emitted by conventional speakers.

Still another object of this invention is to provide a sound reproduction system having resonance chambers which produce a timbre and quality not ordinarily found in conventional sound reproduction systems.

Other objects of this invention will become apparent upon a reading of the following description.

BRIEF DESCRIPTION OF THE DRAWINGS

A preferred embodiment of the invention has been chosen for purposes of illustration and description wherein.

DESCRIPTION OF THE PREFERRED EMBODIMENT

Figure 3:
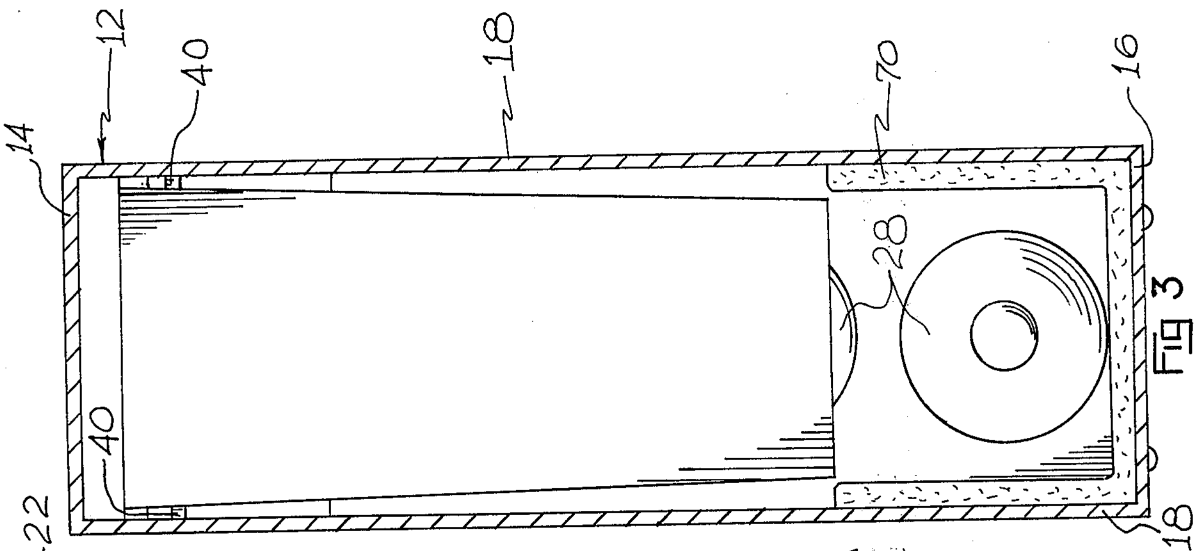
FIG. 3 is a longitudinal section of the sound reproduction system as taken along line 3—3 of FIG. 2.

The preferred embodiment illustrated is not intended to be exhaustive or to limit the invention to the precise form disclosed. It is chosen and described in order to best explain the principles of the invention and its application and practical use to thereby enable others skilled in the art to best utilize the invention.

The sound reproduction system 10 of this invention includes a housing 12 having a top wall 14, a bottom wall 16, side walls 18, a front wall 20, and a rear wall 22. Front wall 20 has two vertically aligned openings 26 near its bottom. A pair of cone speakers 28 are mounted within housing 12 and over openings 26 so as to project sound through openings 26. Front wall 20 also has a lateral slot-shaped opening 30 in its upper end and is covered by a woven cloth 32 or other type of grill arrangement. Rear wall 22 is removable for access to the interior of housing 12.

Three sound reverberation chambers 34, 36, and 38 are positioned interiorly of housing 12. Chamber 34 is attached to housing front wall 20. The top of chamber 34 is aligned with the bottom of slot 30. Chamber 36 is connected to the rear of chamber 34 and chamber 38 is connected to the rear of chamber 36. Both chambers 36 and 38 are suspended within housing 12 by support members 40. Support members 40 are attached to side walls 18 and project therefrom to cradle chambers 36 and 38 so that their upper edges are on a plane with the lower edge of slot 30. Chamber 34 is attached to chamber 36 by a support member 41 which extends between housing side walls 18.

Figure 5:
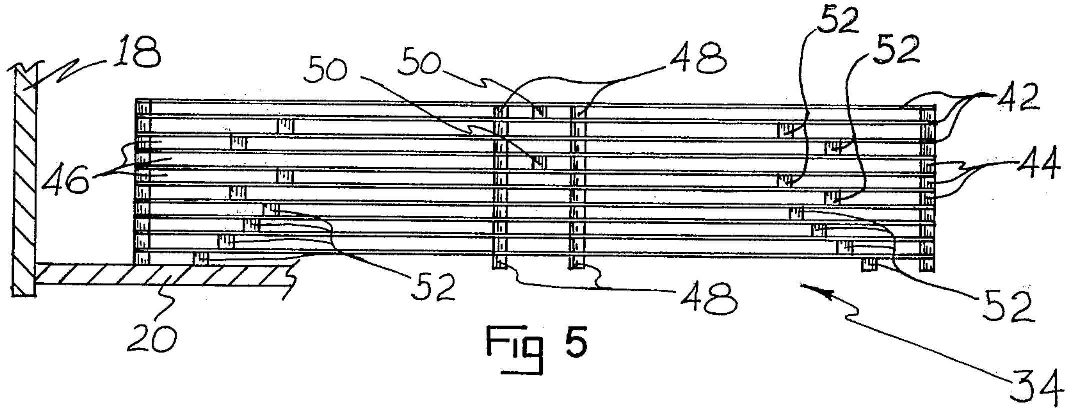
FIG. 5 is an end view of the treble resonating chamber as seen from line 5—5 of FIG. 2.
Figure 6:
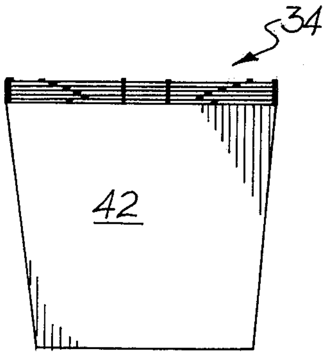
FIG. 6 is a top perspective view of the treble resonating chamber.
Figure 7:
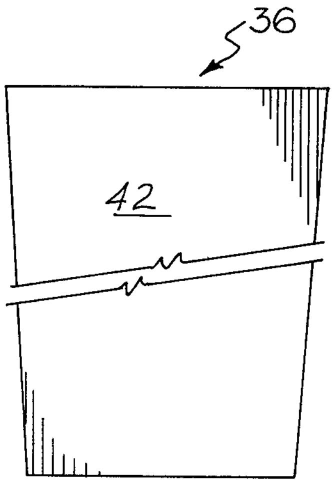
FIG. 7 is an elevational view of the mid-range resonating chamber.
Figure 8:
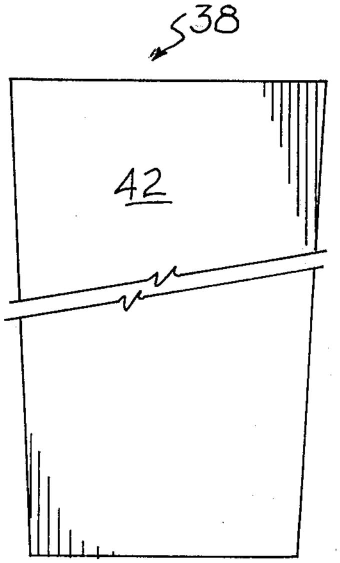
FIG. 8 is an elevational view of the bass resonating chamber.

Each chamber 34, 36, and 38 includes panels 42 which are parallel to each other and spaced apart by spacers 44 positioned at the edges of panels 42 to define compartments 46 between each pair of panels. Panels 42 have a tapering shape as illustrated in FIGS. 6, 7, and 8. Chamber 34 forms a treble resonating chamber and includes ten steel panels 42 which form a total of ten compartments 46 with housing front wall 20 and between the panels. Compartments 46 are designed to resonate and amplify sound within the range of frequencies generally referred to as the treble range and panels 42, when made of steel, provide an optimum vibrational response to the treble range of frequencies. Compartments 46, as shown in FIG. 5, of chamber 34 are divided by a pair of spacers 48 which are spaced parallel to each other along the length of chamber 34. The spacers of each pair of spacers 48 are equally spaced from the center of the compartment. Two compartments 46 of chamber 34 have spacers 50 which are positioned along the compartment center line. The remaining compartments 46 have an additional pair of spacers 52 which extend the length of chamber 34 parallel to but of varying distances from spacers 48. The spacers of each pair of spacers 52 are equidistantly spaced from the centerline of chamber 34. All spacers 48, 50, and 52 of chamber 34 are parallel to the centerline of the chamber and are positioned to from subchambers which are each sized to resonate in response to a certain range of sound frequencies within the overall treble range.

Figure 4:
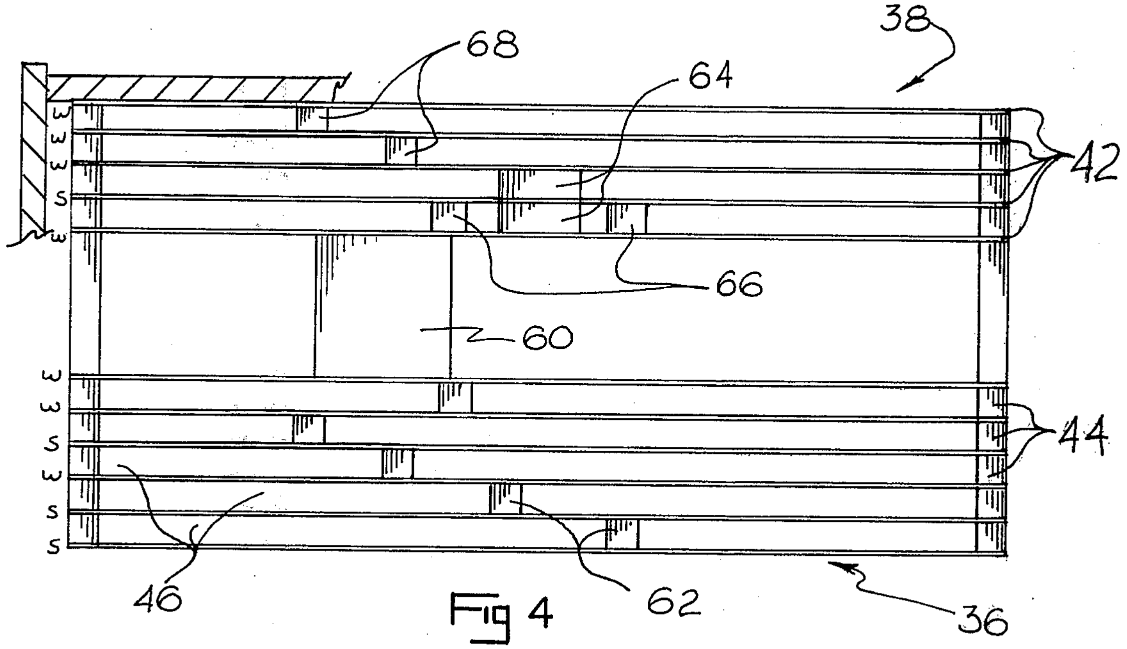
FIG. 4 is an end view of the mid-range and bass resonating chambers as seen from line 4—4 of FIG. 2.

Chambers 36 and 38 are joined together to form a single structural unit. Chambers 36 and 38 are of identical width at the small and the large ends of panels 42. Panels 42 of chamber 36 are shorter than the panels 42 of chamber 38, as illustrated in FIGS. 7 and 8. As can be seen, both chambers 36 and 38 are longer than chamber 34. Spacers 44 of chambers 36 and 38 are of equal thickness but are relatively thicker than spacers 44 of chamber 34. Each compartment 46 of chamber 36 is separated into subchambers by a single spacer 62. Each spacer 62 is parallel to the center line of each compartment 46 and of varying distances therefrom in different compartments to form subchambers of different sizes in order to resonate and amplify different ranges of sound pitches or frequencies within the frequency range generally defined as the mid-range frequencies. Panels 42 of chamber 36 are of alternating steel and wood construction as indicated by the letters "s" and "w" respectively in FIG. 4. The steel panels 42 are used to reproduce more precisely the timbre and quality of the tone produced by instruments made of metal or by striking metal surfaces.

Spacer 60 and associated end spacers 44 of chamber 38 form the largest compartment of all of the chambers. Compartments 46 in chamber 38 are divided in half by spacers 64 with one compartment thereof divided further by a pair of spacers 66, each of which are equally spaced from and parallel to spacer 64. The remaining compartments 46 in chamber 38 are each divided into subchambers of varying sizes by single spacers 68. Chamber 38 contains wood and steel panels 42 as indicated by the letters "w" and "s" respectively in FIG. 4.

Figure 2:
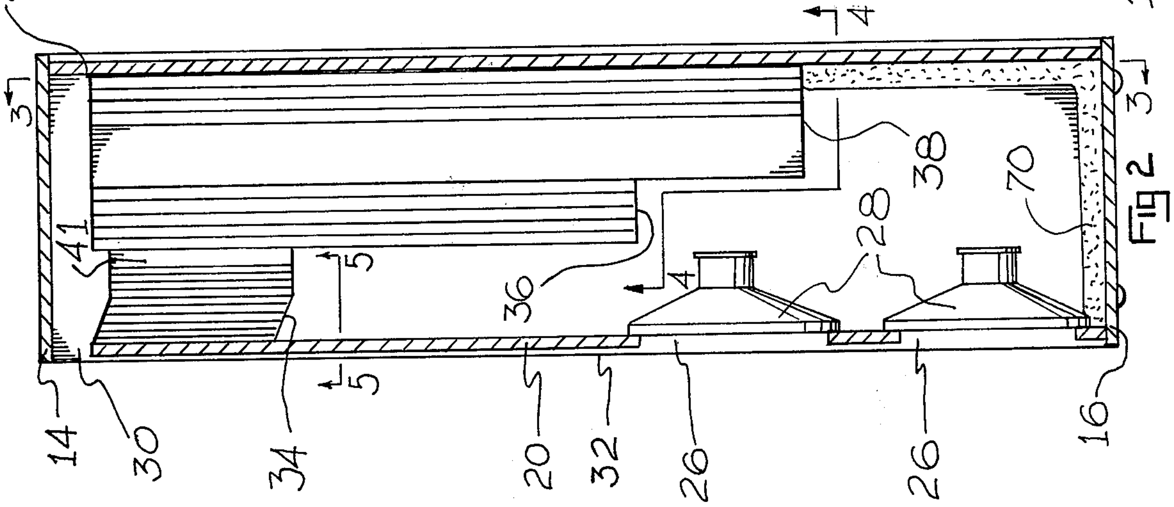
FIG. 2 is a longitudinal section of the sound reproduction system of FIG. 1.
Figure 1:
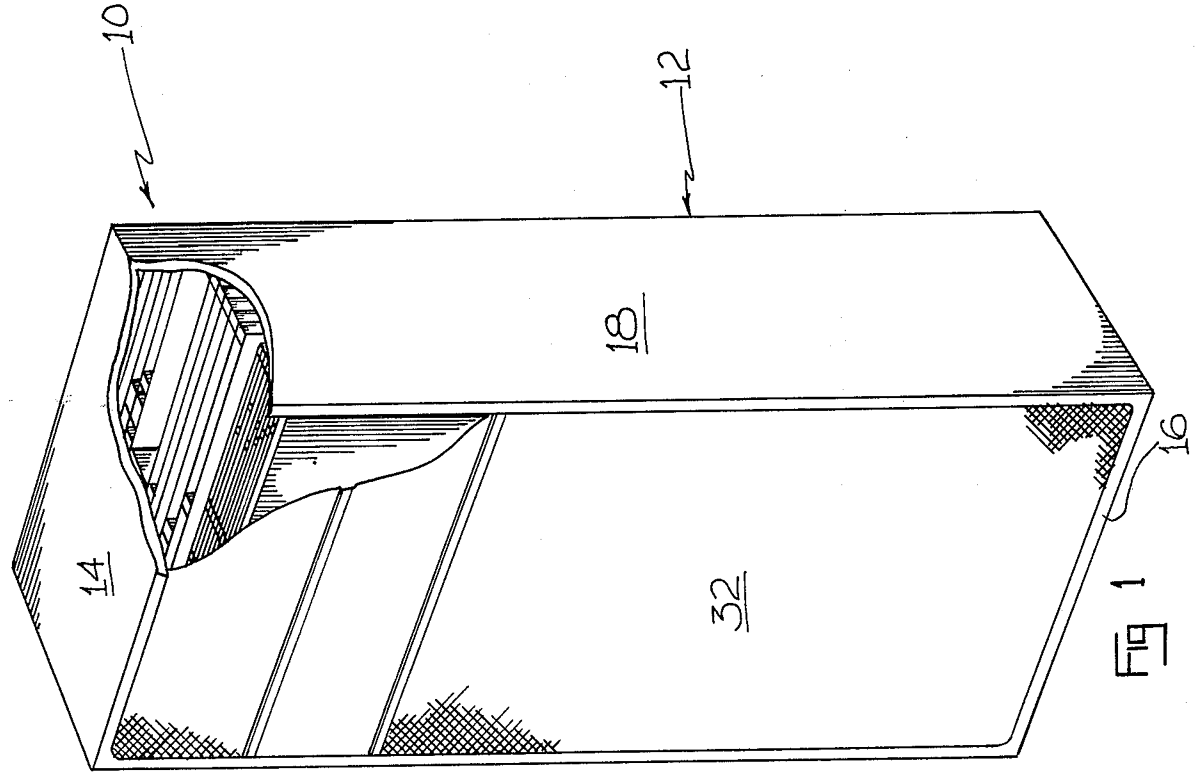
FIG. 1 is a perspective view of the sound reproduction system of the invention with portions of the housing cut away to illustrate the internal construction of the system.

Chambers 34, 36, and 38 are mounted as above described within housing 12 and as illustrated in FIG. 2 with the large ends of panels 42 horizontally aligned with slot 30 and the small ends near speakers 28. The small end of chamber 36 extends to a position just above the uppermost speaker 28 while chamber 38 extends behind the uppermost speaker and terminates above lowermost speaker 28. The first six panels 42 of chamber 34 spaced from front wall 20 and descendingly staggered in a spaced relationship from slot 30 to prevent distortion of the sound being projected. Sound insulating material 70 is attached to side walls 18, rear wall 24 and bottom wall 16.

It is to be understood that the invention is not to be limited to the above described details but may be modified within the scope of the appended claims.

What I claim is:

1. In a sound reproduction system including a closed housing having a front wall, a sound reproduction speaker, an opening through said front wall, said speaker mounted adjacent said opening to project sound therethrough, an elongated sound transmitting slot through said front wall adjacent the upper end thereof, and sound resonating chambers mounted on said front wall between said speakers and said sound transmitting slot, the improvement wherein said sound resonating chambers are a series of panels having tapered sides and spaced from one another parallel to said front wall, said panels separated from one another by spacers having a thickness greater than the thickness of said panels, a pair of said spacers positioned along said tapered sides of each of said panels to form compartments between said panels, the small end of said panels adjacent said speaker and the large end of the panels adjacent said sound transmitting slot, said panels divided into three juxtaposed sections, each section having multiple panels of the same length, said section having three different lengths, a first section having the shortest length forming a treble chamber, a second section having the intermediate length forming a mid-range chamber, a third section having the longest length forming a bass chamber, said first panel section located nearest said housing front wall, said panel third section located furthest from said housing front wall, said second panel section located between said first and third panel sections.

2. The sound reproduction system of claim 1 wherein said first panel section includes ten of said panels forming ten of said compartments, said second panel section including six of said panels spaced from said first panel section forming five of said compartments, said third panel section including five of said panels spaced from said second panel section forming five of said compartments.

3. The sound reproduction system of claim 2 wherein said panels forming said first panel section are made of steel.

4. The sound reproduction system of claim 3 wherein the first, second and fourth panels of said second panel section spaced from said first panel section are steel and the remaining panels of said second section are wood.

5. The sound reproduction system of claim 4 wherein the third panel of said third panel section is steel and the remaining panels of the third panel section are wood.

6. The sound reproduction system of claim 1 wherein each of said compartments formed in said first panel section is divided into subchambers by a second pair of spacers extending the length thereto and located an equal distance from the center line of the first panel section compartment, the distance between each spacer of said second pair of spacers being the same in all of said compartments, eight of said first panel section compartments each divided into smaller subchambers by a third pair of spacers paralleling said second pair of spacers therein and located an equal distance from said compartment centerline, the remaining two of said first panel section compartments each divided into smaller subchambers by a spacer paralleling said second pair of spacers therein and located at said compartment centerline.

7. The sound reproduction system of claim 6 wherein each compartment of said second panel section is divided into subchambers by a spacer extending the length thereof.

8. The sound reproduction system of claim 7 wherein each compartment of said third panel section is divided into subchambers by a spacer extending the length thereof.

9. The second reproduction system of claim 8 wherein one compartment of said third panel section is further divided by two additional spacers extending the length thereof, one said spacer located at the centerline of said one third panel section compartment.

10. The sound reproduction system of claim 1 wherein said housing front wall has a second opening therein, a second speaker mounted adjacent said second opening to project sound therethrough, said first mentioned speaker mounted above said second speaker, said second panel section small end located adjacently above said first mentioned speaker, said third panel section small end extending below said first mentioned speaker to a position adjacently above said second speaker.

* * * * *